(12) United States Patent
Ando

(10) Patent No.: US 9,582,103 B2
(45) Date of Patent: Feb. 28, 2017

(54) TOUCH TYPE INPUT DEVICE HAVING A PIEZOELECTRIC SENSOR CONNECTED TO A DISPLACEMENT DETECTOR AND A SOUND EMISSION CONTROLLER BY A SWITCH

(71) Applicant: Murata Manufacturing Co., Ltd., Nagaokakyo-shi, Kyoto-fu (JP)

(72) Inventor: Masamichi Ando, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 95 days.

(21) Appl. No.: 14/658,273

(22) Filed: Mar. 16, 2015

(65) Prior Publication Data

US 2015/0185955 A1 Jul. 2, 2015

Related U.S. Application Data

(63) Continuation of application No. PCT/JP2013/074479, filed on Sep. 11, 2013.

(30) Foreign Application Priority Data

Sep. 17, 2012 (JP) ................................ 2012-203747

(51) Int. Cl.
*G06F 3/041* (2006.01)
*G06F 3/0354* (2013.01)
(Continued)

(52) U.S. Cl.
CPC ........ *G06F 3/0416* (2013.01); *G06F 3/03547* (2013.01); *G06F 3/041* (2013.01);
(Continued)

(58) Field of Classification Search
CPC .... G06F 3/0416; G06F 3/03547; G06F 3/165; G06F 3/0414; G06F 3/044;
(Continued)

(56) References Cited

U.S. PATENT DOCUMENTS

2002/0149561 A1 10/2002 Fukumoto et al.
2006/0028095 A1 2/2006 Maruyama et al.
(Continued)

FOREIGN PATENT DOCUMENTS

JP 2002-149312 A 5/2002
JP 2006-048302 A 2/2006
(Continued)

OTHER PUBLICATIONS

International Search Report for PCT/JP2013/074479, date of mailing Dec. 10, 2013.
(Continued)

*Primary Examiner* — Larry Sternbane
(74) *Attorney, Agent, or Firm* — Arent Fox LLP

(57) ABSTRACT

A touch panel having a piezoelectric sensor and an electrostatic sensor that are integrally formed. The piezoelectric sensor is connected to a displacement detector and a sound emission amplifier through a relay switch. A controller performs switch control on the relay switch. The piezoelectric sensor emits sound while the sound emission amplifier and the piezoelectric sensor are connected to each other by the relay switch. When the operation input is detected through the electrostatic sensor and the touch position detector, the controller performs the switch control on the relay switch to connect the piezoelectric sensor to the displacement detector. A detection voltage is input from the piezoelectric sensor to the displacement detector to also detect the pressing amount.

12 Claims, 6 Drawing Sheets

(51) Int. Cl.
*G06F 3/16* (2006.01)
*G06F 3/044* (2006.01)
*H03K 17/96* (2006.01)

(52) U.S. Cl.
CPC ............ *G06F 3/044* (2013.01); *G06F 3/0414* (2013.01); *G06F 3/165* (2013.01); *H03K 17/962* (2013.01); *H03K 17/964* (2013.01); *G06F 2203/04101* (2013.01); *G06F 2203/04111* (2013.01)

(58) Field of Classification Search
CPC ........... G06F 3/041; G06F 2203/04101; G06F 2203/04111; H03K 17/962; H03K 17/964
See application file for complete search history.

(56) References Cited

U.S. PATENT DOCUMENTS

| | | | | |
|---|---|---|---|---|
| 2010/0194705 | A1* | 8/2010 | Kim | ..................... G06F 1/1626 345/173 |
| 2011/0007908 | A1* | 1/2011 | Rosener | ............... H04R 1/1041 381/74 |
| 2011/0221694 | A1* | 9/2011 | Karaoguz | ............... G06F 3/016 345/173 |
| 2011/0310058 | A1 | 12/2011 | Yamada et al. | |
| 2012/0162114 | A1 | 6/2012 | Inoue et al. | |
| 2013/0108061 | A1 | 5/2013 | Ando et al. | |
| 2013/0222126 | A1* | 8/2013 | Aono | ..................... G06F 3/041 340/407.2 |

FOREIGN PATENT DOCUMENTS

| | | | |
|---|---|---|---|
| JP | 2010-198385 A | 9/2010 | |
| JP | WO 2012114763 A1 * | 8/2012 | .............. H04M 1/18 |
| WO | WO 2011/024435 A1 | 3/2011 | |
| WO | WO 2011/125048 A1 | 10/2011 | |
| WO | WO 2012/026521 A1 | 3/2012 | |
| WO | WO 2012/063497 A1 | 5/2012 | |
| WO | WO 2012/114763 A1 | 8/2012 | |

OTHER PUBLICATIONS

Written Opinion of the International Search Authority issued for PCT/JP2013/074479 date of mailing Dec. 10, 2013.

* cited by examiner

TOUCH TYPE INPUT DEVICE HAVING A PIEZOELECTRIC SENSOR CONNECTED TO A DISPLACEMENT DETECTOR AND A SOUND EMISSION CONTROLLER BY A SWITCH

CROSS REFERENCE TO RELATED APPLICATIONS

The present application is a continuation of International application No. PCT/JP2013/074479, filed Sep. 11, 2013, which claims priority to Japanese Patent Application No. 2012-203747, filed Sep. 17, 2012, the entire contents of each of which are incorporated herein by reference.

FIELD OF THE INVENTION

The present invention relates to a touch type input device that can perform operation input detection and sound emission.

BACKGROUND OF THE INVENTION

Conventionally, there have been devised various touch type input devices that can detect a touch position when an operator touches a planar operation surface with a finger or the like.

For example, in a touch type input device described in PTL 1, electrodes are formed on both surfaces of a piezoelectric film, and a voltage generated by pressing the piezoelectric film is detected by the electrodes on both the surfaces, thereby detecting a pressing position, namely, an operation input position is detected.

In the touch type input device of PTL 1, the voltage is applied to the electrodes on both the surfaces to bend the piezoelectric film, thereby emitting the sound.

In the touch type input device of PTL 1, an operation input detecting circuit and a sound emission signal applying circuit are switched by a relay circuit and connected to a touch panel. Therefore, the operation input detection and the sound emission are switched by one touch panel.

PTL 1: WO2011/125048

SUMMARY OF THE INVENTION

However, in the touch type input device of PTL 1, the voltage generated by pressing the piezoelectric film can hardly be detected because the operation input detecting circuit and the touch panel are not connected to each other during the sound emission.

That is, in the touch type input device of PTL 1, an operation input detecting function and a sound emitting function can only entirely independently be performed.

An object of the present invention is to provide a touch type input device that, using one touch panel, can detect the operation input during the sound emission and correctly detect a pressing amount and a pressing position after the detection.

According to one aspect of the present invention, a touch type input device includes: a touch panel in which a piezoelectric sensor and an electrostatic sensor are integrally formed; a touch position detector that detects an operation input from a touch position detection voltage of the electrostatic sensor; and a displacement detector that detects a pressing amount from a detection voltage of the piezoelectric sensor.

The touch type input device also includes a sound emission controller, a switch unit, and a controller. The sound emission controller provides a sound emission signal to the piezoelectric sensor. The switch unit switches the connection of the displacement detector and the sound emission controller to the piezoelectric sensor. The controller receives an operation input detection result from the touch position detector, and controls the switch unit such that the displacement detector and the piezoelectric sensor are connected to each other.

In the above configuration, after the electrostatic sensor detects the operation input, a transition from the sound emission to the pressing amount detection is made. Therefore, the operation input is surely detected while the sound is emitted, and the transition to the pressing amount detection can surely be made. At this point, the touch panel is the only device on which the switching operation input is performed, and therefore the configuration of the touch type input device can be simplified.

According to another aspect of the present invention, a touch type input device includes: a touch panel in which a piezoelectric sensor and an electrostatic sensor are integrally formed; a touch position detector that detects an operation input from a touch position detection voltage of the electrostatic sensor; and a displacement detector that detects a pressing amount from a detection voltage of the piezoelectric sensor.

The touch type input device also includes a sound emission controller, a switch unit, and a controller. The sound emission controller includes a source playback unit and a sound emission amplifier, the source playback unit generating a sound emission signal provided to the piezoelectric sensor, the sound emission amplifier amplifying the sound emission signal to output the amplified sound emission signal to the piezoelectric sensor.

The switch unit switches between two paths, and the switch unit switches between a first path and a second path in response to a switch control signal, the displacement detector and the controller being connected to each other in the first path, the source playback unit and the sound emission amplifier being connected to each other in the second path.

The controller outputs the switch control signal switching between the two paths to the switch unit, and the controller receives an operation input detection result from the touch position detector, and generates the switch control signal switching from the second path to the first path.

Even in the configuration, the operation input is surely detected while the sound is emitted, and the transition to the pressing amount detection can surely be made. At this point, the touch panel is the only device on which the switching operation input is performed, and therefore the configuration of the touch type input device can be simplified.

In the touch type input device, preferably a main body forming the piezoelectric sensor and the electrostatic sensor is a single piezoelectric film, and an electrostatic capacitance detecting electrode and a displacement detecting electrode are formed on an identical surface in a composite manner.

In the configuration, the one main body forms the piezoelectric sensor and the electrostatic sensor which constitute a touch panel, so that the touch panel can be formed thinner.

In the touch type input device, preferably the piezoelectric film is made of poly lactic acid that is uniaxially drawn in a predetermined direction.

In the configuration, the displacement of the piezoelectric film can be detected with higher sensitivity. That is, the piezoelectric sensor having a higher detection frequency and excellent sound emission efficiency can be made.

According to the present invention, the operation input can be detected during the sound emission using one touch panel. Additionally, the pressing amount and the pressing position can correctly be detected after the detection using one touch panel.

DETAILED DESCRIPTION OF THE INVENTION

Figure 1:
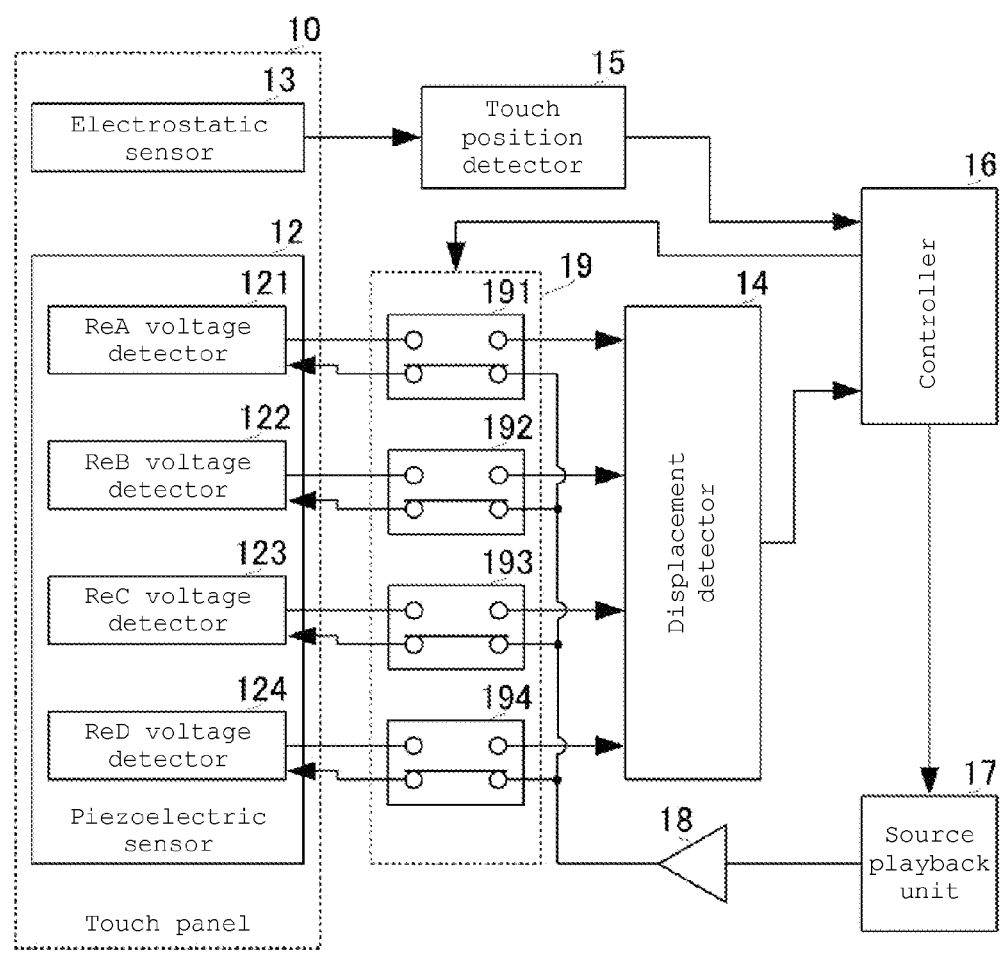
FIG. 1 is a block diagram of a touch type input device according to a first embodiment of the present invention.
Figure 2A:
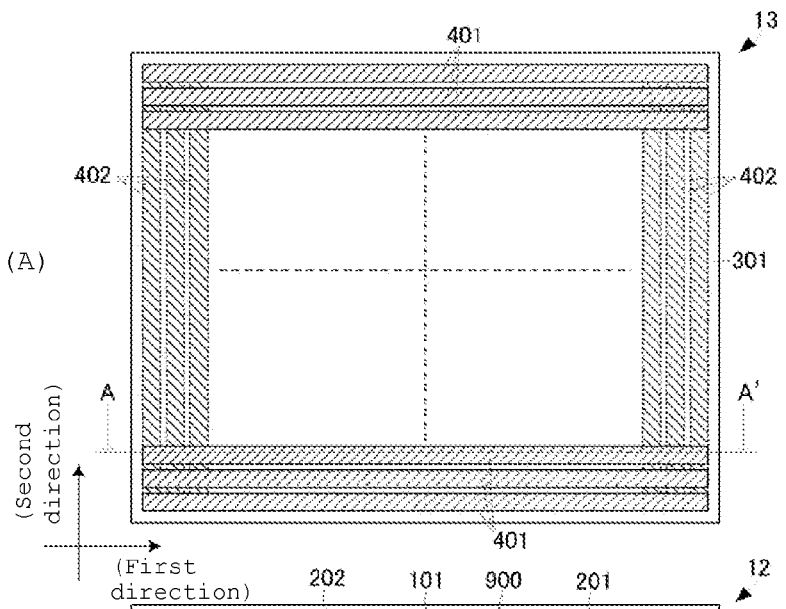
FIGS. 2(A) to 2(C) are configuration diagrams of a touch panel used in the touch type input device of the first embodiment of the present invention.
Figure 2B:
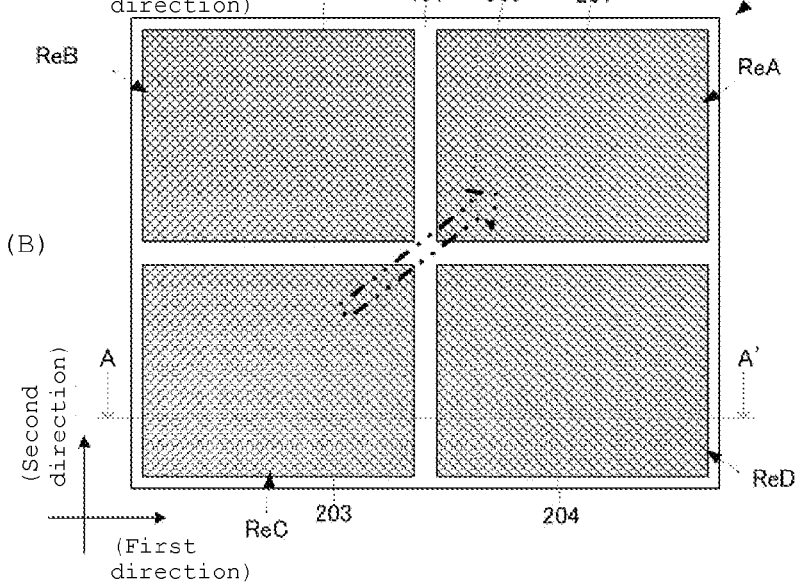
Figure 2C:
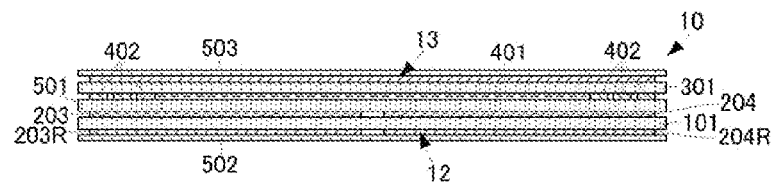

A touch type input device according to a first embodiment of the present invention will be described with reference to the drawings. FIG. 1 is a block diagram of the touch type input device of the first embodiment of the present invention. FIGS. 2(A) to 2(C) are configuration diagrams of a touch panel used in the touch type input device of the first embodiment of the present invention.

A touch type input device 1 includes a touch panel 10, a displacement detector 14, a touch position detector 15, a controller 16, a source playback unit 17, a sound emission amplifier 18, and a relay switch 19. The source playback unit 17 and the sound emission amplifier 18 correspond to the "sound emission controller" of the present invention. The relay switch 19 corresponds to the "switch unit" of the present invention.

The touch panel 10 includes a piezoelectric sensor 12 and an electrostatic sensor 13. The piezoelectric sensor 12 includes an ReA voltage detector 121, an ReB voltage detector 122, an ReC voltage detector 123, and an ReD voltage detector 124. The touch panel 10 is constructed with a structure in FIGS. 2(A) to 2(C).

The piezoelectric sensor 12 includes a piezoelectric film 101 and displacement detecting electrodes 201, 202, 203, 204, 201R, 202R, 203R, and 204R.

The piezoelectric film 101 is constructed with a rectangular flat film including a first principal surface and a second principal surface, which face each other. At this point, a longitudinal direction is referred to as a first direction, and a transverse direction is referred to as a second direction. The piezoelectric film 101 is made of poly-L-lactic acid (PLLA) drawn in at least a uniaxial direction. In the first embodiment, the piezoelectric film 101 is uniaxially drawn in a direction nearly along a diagonal line of a rectangle (see clear arrow indicated by the long-dashed double dotted line in FIG. 2(B)). Hereinafter, the direction nearly along the diagonal line is referred to as a uniaxial drawing direction 900. When the piezoelectric film 101 has a square shape, preferably the uniaxial drawing direction 900 is along the diagonal line. When the piezoelectric film 101 has a rectangular shape, preferably the uniaxial drawing direction 900 has an angle of 45° with respect to a first direction or a second direction. However, the angle is not limited to 45°, and the optimum angle may be designed in consideration of characteristics of the piezoelectric film 101 or a usage state of the device. The uniaxial drawing direction 900 is designed to form a predetermined angle with respect to the first direction and second direction of the piezoelectric film 101.

The displacement detecting electrodes 201, 202, 203, and 204 are formed in a first principal surface that is one of principal surfaces of the piezoelectric film 101 made of the PLLA having the above characteristics. The displacement detecting electrodes 201, 202, 203, and 204 are formed to a shape that is corresponding to a shape which is obtained by dividing the first principal surface of the piezoelectric film 101 into four equal parts. More specifically, the displacement detecting electrodes 201 and 202 are formed so as to be arranged along the first direction of the piezoelectric film 101. The displacement detecting electrodes 203 and 204 are formed so as to be arranged along the first direction of the piezoelectric film 101. The displacement detecting electrodes 201 and 203 are formed so as to be arranged along the second direction of the piezoelectric film 101. The displacement detecting electrodes 202 and 204 are formed so as to be arranged along the second direction of the piezoelectric film 101.

In the configuration, the displacement detecting electrodes 201 and 203 are arranged so as to be located on one of the diagonal lines of the piezoelectric film 101. The displacement detecting electrodes 202 and 204 are arranged so as to be located on the other diagonal line of the piezoelectric film 101. The displacement detecting electrodes 201 to 204 are arranged so as to have rotational symmetries of 180° with respect to the center of an operation surface in planar view.

The displacement detecting electrodes 201R, 202R, 203R, and 204R are formed in a second principal surface that is the other principal surface of the piezoelectric film 101. The displacement detecting electrode 201R has an area substantially equal to that of the displacement detecting electrode 201, and is formed at a position where a substantially whole surface of the displacement detecting electrode 201R faces the displacement detecting electrode 201. The displacement detecting electrode 202R has an area substantially equal to that of the displacement detecting electrode 202, and is formed at a position where a substantially whole surface of the displacement detecting electrode 202R faces the displacement detecting electrode 202. The displacement detecting electrode 203R has an area substantially equal to that of the displacement detecting electrode 203, and is formed at a position where a substantially whole surface of the displacement detecting electrode 203R faces the displacement detecting electrode 203. The displacement detecting electrode 204R has an area substantially equal to that of the displacement detecting electrode 204, and is formed at a position where a substantially whole surface of the displacement detecting electrode 204R faces the displacement detecting electrode 204.

An organic electrode mainly containing ITO, ZnO, or polythiophene, an organic electrode mainly containing polyaniline, a silver nanowire electrode, or a carbon nanotube electrode is suitably used as the displacement detecting electrodes 201 to 204 and 201R to 204R. A highly-translucent electrode pattern can be formed by the use of these materials. An electrode made of a silver paste or a metallic electrode formed by evaporation, sputtering, or plating can be used when translucency is not required. The organic electrode mainly containing highly flexible polythiophene, the organic electrode mainly containing polyaniline, the silver nanowire electrode, the carbon nanotube electrode, or the metallic electrode is particularly suitable because the touch panel 10 is largely displaced.

In the piezoelectric film 101, a region sandwiched between the displacement detecting electrodes 201 and 201R constitutes a detection region ReA, and acts as an ReA voltage detector 121. In the piezoelectric film 101, a region sandwiched between the displacement detecting electrodes 202 and 202R constitutes a detection region ReB, and acts as an ReB voltage detector 122. In the piezoelectric film 101, a region sandwiched between the displacement detecting electrodes 203 and 203R constitutes a detection region ReC, and acts as an ReC voltage detector 123. In the piezoelectric film 101, a region sandwiched between the displacement detecting electrodes 204 and 204R constitutes a detection region ReD, and acts as an ReD voltage detector 124.

A bending vibration of the piezoelectric film 100 can be generated by applying a voltage between the displacement detecting electrodes 201, 202, 203, and 204 and the displacement detecting electrodes 201R, 202R, 203R, and 204R based on a sound emission signal. Therefore, the whole piezoelectric film 100 including the ReA voltage detector 121, the ReB voltage detector 122, the ReC voltage detector 123, and the ReD voltage detector 124 can act as a speaker (sound emission device).

The piezoelectric sensor 12 having the above configuration is bonded to a planar base board 501. At this point, as illustrated in FIG. 2(C), the piezoelectric sensor 12 is bonded to the base board 501 such that the first principal surface and second principal surface of the piezoelectric film 101 of the piezoelectric sensor 12 are parallel to the principal surface of the base board 501.

The base board 501 is made of a relatively-high-strength polymer such as polyethylene terephthalate (PET), polyethylene naphthalate (PEN), polycarbonate (PC), and acrylic resin (PMMA). The thickness of the base board 501 is properly determined according to the strength necessary for the base board 501.

The electrostatic sensor 13 includes abase film 301, plural segment electrodes 401, and plural common electrodes 402. The base film 301 is constructed with a rectangular flat film including a third principal surface and a fourth principal surface, which face each other. The base film 301 is made of a material having a predetermined dielectric constant, and the base film 301 has such a strength that the displacement of the base board 501 is not disturbed as much as possible. The base film 301 is suitably made of a material having translucency.

The plural segment electrodes 401 are arrayed at predetermined intervals in the third principal surface that is one of principal surfaces of the base film 301. Each of the plural segment electrodes 401 is formed into a lengthy shape, and the plural segment electrodes 401 are arrayed along a direction orthogonal to a lengthy direction.

The plural common electrodes 402 are arrayed at predetermined intervals in the fourth principal surface that is the other principal surface of the base film 301. Each of the plural common electrodes 402 is formed into a lengthy shape, and the plural common electrodes 402 are arrayed along the direction orthogonal to the lengthy direction. When viewed from the directions orthogonal to the third principal surface and fourth principal surface, the plural segment electrodes 401 and the plural common electrodes 402 are formed such that the lengthy directions of the plural common electrodes 402 are substantially orthogonal to the lengthy directions of the plural segment electrodes 401.

The segment electrode 401 and the common electrode 402 may be made of a material identical to that for the displacement detecting electrodes 201 to 204 and 201R to 204R.

With this configuration, an electrostatic capacitance between the segment electrode and the common electrode changes according to the position which a finger operating the touch panel 10 comes close to or into contact with. An electrostatic capacitance type touch position detection panel that detects a touch position by detecting the change can be made.

The electrostatic sensor 13 having the above configuration is bonded to the base board 501 at an opposite side to the piezoelectric sensor 12 that is bonded to the base board 501.

A protective film 503 is provided on a surface of the electrostatic sensor 13 on the side opposite to the base board 501. The protective film 503 is made of a material having flexibility and an insulating property. The protective film 503 is made of a material having translucency. For example, PET or PP is used for the protective film 503.

A protective film 502 is provided on a surface of the piezoelectric sensor 12 on the side opposite to the base board 501. The protective film 502 is made of a material having the insulating property. The protective film 502 is made of a material having translucency. For example, PET or PP is used for the protective film 502.

With the above configuration, the touch panel 10 including the piezoelectric sensor 12 and the electrostatic sensor 13 can be formed into a planar shape, namely, a low profile. The base board 501, the piezoelectric sensor 12, the electrostatic sensor 13, and the protective films 502 and 503 are all made of materials having translucency, which allows the touch type input device 1 to be translucent.

The piezoelectric sensor 12 and electrostatic sensor 13 of the touch panel 10 are connected to each subsequent circuit as illustrated in FIG. 1.

The ReA voltage detector 121 of the piezoelectric sensor 12 is selectively connected to one of the displacement detector 14 and the sound emission amplifier 18 by a switch 191. When the ReA voltage detector 121 is connected to the displacement detector 14, a detection voltage output from the ReA voltage detector 121, namely, a voltage generated between the displacement detecting electrodes 201 and 201R by the displacement of the piezoelectric film 101 is output to the displacement detector 14. When the ReA voltage detector 121 is connected to the sound emission amplifier 18, the voltage based on the sound emission signal is applied between the displacement detecting electrodes 201 and 201R.

The ReB voltage detector 122 of the piezoelectric sensor 12 is selectively connected to one of the displacement detector 14 and the sound emission amplifier 18 by a switch 192. When the ReB voltage detector 122 is connected to the displacement detector 14, the detection voltage output from the ReB voltage detector 122, namely, the voltage generated between the displacement detecting electrodes 202 and 202R by the displacement of the piezoelectric film 101 is output to the displacement detector 14. When the ReB voltage detector 122 is connected to the sound emission amplifier 18, the voltage based on the sound emission signal is applied between the displacement detecting electrodes 202 and 202R.

The ReC voltage detector 123 of the piezoelectric sensor 12 is selectively connected to one of the displacement detector 14 and the sound emission amplifier 18 by a switch 193. When the ReC voltage detector 123 is connected to the displacement detector 14, the detection voltage output from the ReC voltage detector 123, namely, the voltage generated between the displacement detecting electrodes 203 and 203R by the displacement of the piezoelectric film 101 is output to the displacement detector 14. When the ReC voltage detector 123 is connected to the sound emission amplifier 18, the voltage based on the sound emission signal is applied between the displacement detecting electrodes 203 and 203R.

The ReD voltage detector 124 of the piezoelectric sensor 12 is selectively connected to one of the displacement detector 14 and the sound emission amplifier 18 by a switch 194. When the ReD voltage detector 124 is connected to the displacement detector 14, the detection voltage output from the ReD voltage detector 124, namely, the voltage generated between the displacement detecting electrodes 204 and 204R by the displacement of the piezoelectric film 101 is output to the displacement detector 14. When the ReD voltage detector 124 is connected to the sound emission amplifier 18, the voltage based on the sound emission signal is applied between the displacement detecting electrodes 204 and 204R.

The displacement detector 14 detects a pressing amount based on the detection voltages output from the ReA voltage detector 121, the ReB voltage detector 122, the ReC voltage detector 123, and the ReD voltage detector 124. Specifically, for example, a relationship between voltage values of the ReA voltage detector 121, the ReB voltage detector 122, the ReC voltage detector 123, and the ReD voltage detector 124 and the pressing amount is previously tabulated and stored in the displacement detector 14. When acquiring the detection voltages from the ReA voltage detector 121, the ReB voltage detector 122, the ReC voltage detector 123, and the ReD voltage detector 124, the displacement detector 14 refers to the detection voltages and the table to detect the pressing amount. The displacement detector 14 outputs the detected pressing amount to the controller 16.

Each segment electrode 401 and each common electrode 402 of the electrostatic sensor 13 are connected to the touch position detector 15. A touch position detection voltage detected by the electrostatic sensor 13 is output to the touch position detector 15. The touch position detector 15 detects a touch position on an operation surface from a combination of the segment electrode 401 and common electrode 402, in which the touch position detection voltages are detected. The touch position detector 15 outputs a touch position detection result to the controller 16.

The controller 16 outputs a switch control signal to each of the switches 191, 192, 193, and 194 of the relay switch 19 based on the touch position detection result.

Specifically, when detecting that an operator's finger is in close proximity or in contact with the touch panel 10 from the touch position detection result, the controller 16 outputs the switch control signal switching a sound emitting circuit configuration to a pressing amount detecting circuit configuration to the relay switch 19. In other words, when detecting an operation input from the touch position detection result, the controller 16 outputs the switch control signal switching the sound emitting circuit configuration to the pressing amount detecting circuit configuration to the relay switch 19.

In response to the switch control signal, the switches 191, 192, 193, and 194 switch the connection of the ReA voltage detector 121, the ReB voltage detector 122, the ReC voltage detector 123, and the ReD voltage detector 124 from the sound emission amplifier 18 to the displacement detector 14.

On the other hand, when detecting that the operator's finger is not in close proximity or in contact with the touch panel 10 from the touch position detection result, the controller 16 outputs the switch control signal switching the pressing amount detecting circuit configuration to the sound emitting circuit configuration to the relay switch 19. In other words, when detecting that the operation input is not performed from the touch position detection result, the controller 16 outputs the switch control signal switching the pressing amount detecting circuit configuration to the sound emitting circuit configuration to the relay switch 19.

In response to the switch control signal, the switches 191, 192, 193, and 194 switch the connection of the ReA voltage detector 121, the ReB voltage detector 122, the ReC voltage detector 123, and the ReD voltage detector 124 from the displacement detector 14 to the sound emission amplifier 18.

The controller 16 performs sound emission control on the source playback unit 17 based on the touch position detection result. Specifically, in a period during which the controller 16 detects that the operation input is not performed from the touch position detection result, the controller 16 controls the source playback unit 17 such that the source playback unit 17 outputs a sound emission signal of a predetermined sound. The source playback unit 17 generates the sound emission signal to output the generated sound emission signal to the sound emission amplifier 18, and the sound emission amplifier 18 amplifies the sound emission signal to output the amplified sound emission signal to each of the switches 191, 192, 193, and 194 of the relay switch 19.

On the other hand, when detecting the operation input from the touch position detection result, the controller 16 controls the source playback unit 17 such that the source playback unit 17 stops the output of the sound emission signal.

After detecting the operation input from the touch position detection result and acquiring the pressing amount from the displacement detector 14, the controller 16 performs predetermined control processing as a general touch type input device based on the detected touch position and the pressing amount.

Figure 3:
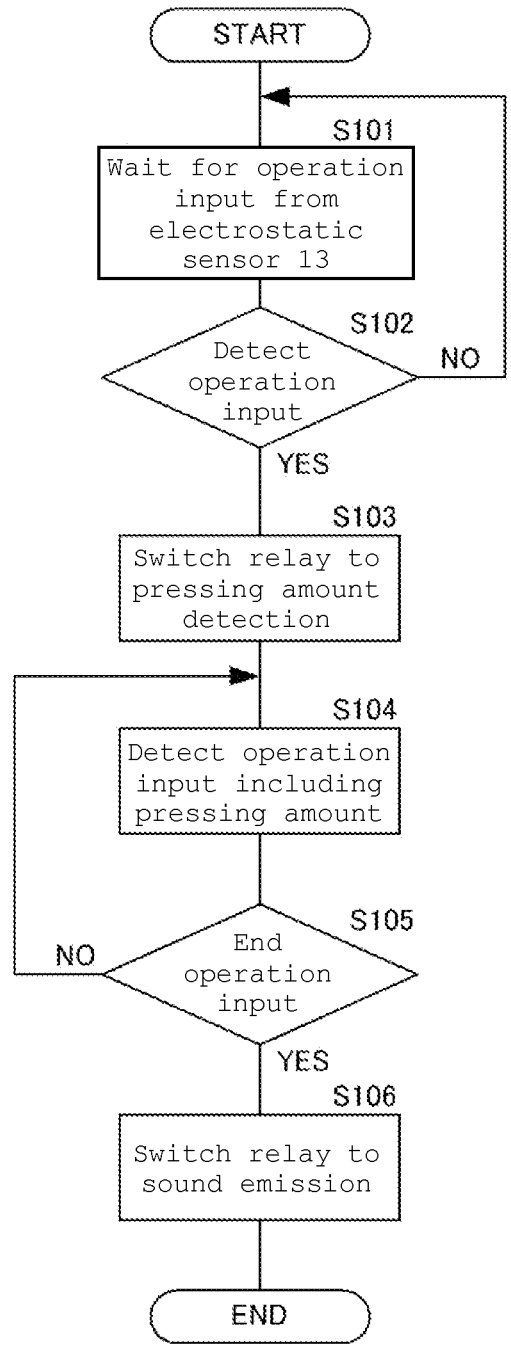
FIG. 3 is a flowchart illustrating switch control for pressing amount detection and sound emission in the touch type input device of the first embodiment of the present invention.

The touch type input device 1 performs the pressing amount detection and the sound emission by switching between the pressing amount detection and the sound emission in the following way. FIG. 3 is a flowchart illustrating the switch control for the pressing amount detection and the sound emission in the touch type input device of the first embodiment of the present invention.

First, the touch type input device 1 waits for the operation input from the electrostatic sensor 13 (S101). At this point, in the touch type input device 1, the ReA voltage detector 121, the ReB voltage detector 122, the ReC voltage detector 123, and the ReD voltage detector 124 of the piezoelectric sensor 12 are connected to the sound emission amplifier 18, and the sound emission signal generated by the source playback unit 17 is provided to the ReA voltage detector 121, the ReB voltage detector 122, the ReC voltage detector 123, and the ReD voltage detector 124. Therefore, the touch panel 10 emits a predetermined sound.

Until the electrostatic sensor 13 detects the operation input, the touch type input device 1 waits for the operation input to be received, and continues the sound emission (NO in S102→S101).

When the electrostatic sensor 13 detects the operation input (YES in S102), the touch type input device 1 switches the switches 191, 192, 193, and 194 of the relay switch 19 to the pressing amount detecting circuit configuration. That is, the ReA voltage detector 121, the ReB voltage detector 122, the ReC voltage detector 123, and the ReD voltage detector 124 are switched so as to be connected to the displacement detector 14 (S103).

In the configuration of the first embodiment, using one touch panel 10, the sound emission can be continued until the operation input is detected, and the operation input can be detected during the sound emission state.

After the ReA voltage detector 121, the ReB voltage detector 122, the ReC voltage detector 123, and the ReD voltage detector 124 are connected to the displacement detector 14, the touch type input device 1 detects the pressing amount based on the detection voltages of the ReA voltage detector 121, the ReB voltage detector 122, the ReC voltage detector 123, and the ReD voltage detector 124 of the piezoelectric sensor 12. At this point, the touch type input device 1 also detects a pressing position (operation position) using the electrostatic sensor 13 (S104).

The touch type input device 1 continues to detect the operation position and the pressing amount while the electrostatic sensor 13 continuously detects the operation input (NO in S105→S104).

When the electrostatic sensor 13 ends the detection of the operation input (YES in S105), the touch type input device 1 switches the switches 191, 192, 193, and 194 of the relay switch 19 to the sound emitting circuit configuration. That is, the ReA voltage detector 121, the ReB voltage detector 122, the ReC voltage detector 123, and the ReD voltage detector 124 are switched so as to be connected to the sound emission amplifier 18 (S106).

Therefore, the predetermined sound is emitted again after the operation input is ended.

Thus, in the configuration of the first embodiment, it is not necessary to separately perform the switch control in order to emit the sound again.

Figure 4:
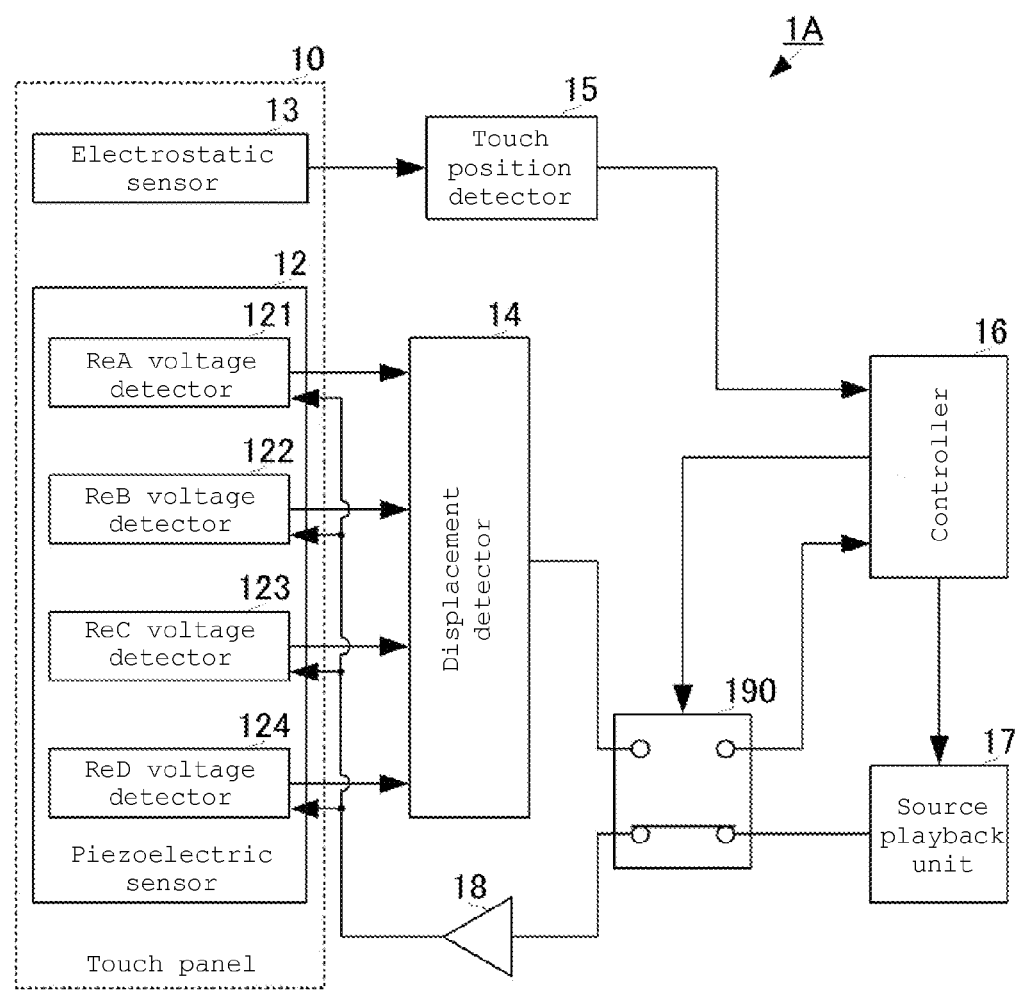
FIG. 4 is a block diagram of a touch type input device according to a second embodiment of the present invention.

A touch type input device according to a second embodiment of the present invention will be described with reference to FIG. 4. FIG. 4 is a block diagram of the touch type input device of the second embodiment of the present invention.

A touch type input device 1A of the second embodiment differs from the touch type input device 1 of the first embodiment in a configuration of a relay switch 190. Accordingly, only the differences will specifically be described below.

The ReA voltage detector 121, the ReB voltage detector 122, the ReC voltage detector 123, and the ReD voltage detector 124 of the piezoelectric sensor 12 are connected to both the displacement detector 14 and the sound emission amplifier 18.

In the switch 190, a first terminal is connected to the displacement detector 14, and a second terminal is connected to the controller 16. In the switch 190, a third terminal is connected to the source playback unit 17, and a fourth terminal is connected to the sound emission amplifier 18. The switch 190 switches between a first mode and a second mode in response to the switch control signal from the controller 16. In the first mode, the first terminal and the second terminal are short-circuited while the third terminal and the fourth terminal are opened. In the second mode, the first terminal and the second terminal are opened while the third terminal and the fourth terminal are short-circuited. Specifically, when the switch control signal switching to the pressing amount circuit configuration is input from the controller 18, the switch 190 is operated so as to become the first mode. When the switch control signal switching to the sound emitting circuit configuration is input from the controller 16, the switch 190 is operated so as to become the second mode.

In the configuration of the second embodiment, similar effects to those of the first embodiment can be obtained. Additionally, in the configuration of the second embodiment, the switch 190 has the shape identical to that of one of the switches 191, 192, 193, and 194 of the first embodiment, so that the circuit associated with the switch control can be downsized. Accordingly, the touch type input device of the present invention is effective in applications where low profile devices are required.

Figure 5:
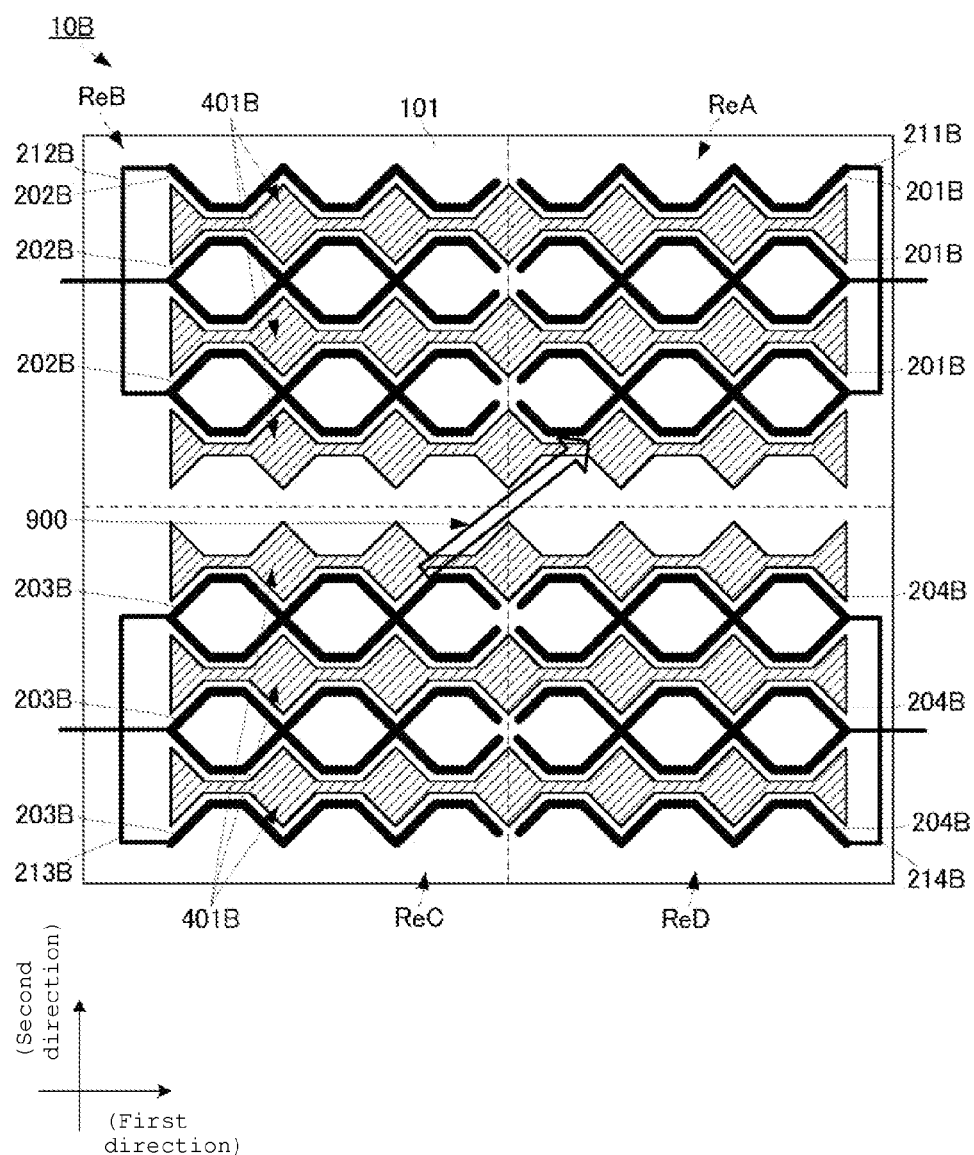
FIG. 5 is a plan view illustrating a structure of a touch panel in a touch type input device according to a third embodiment of the present invention.
Figure 6:
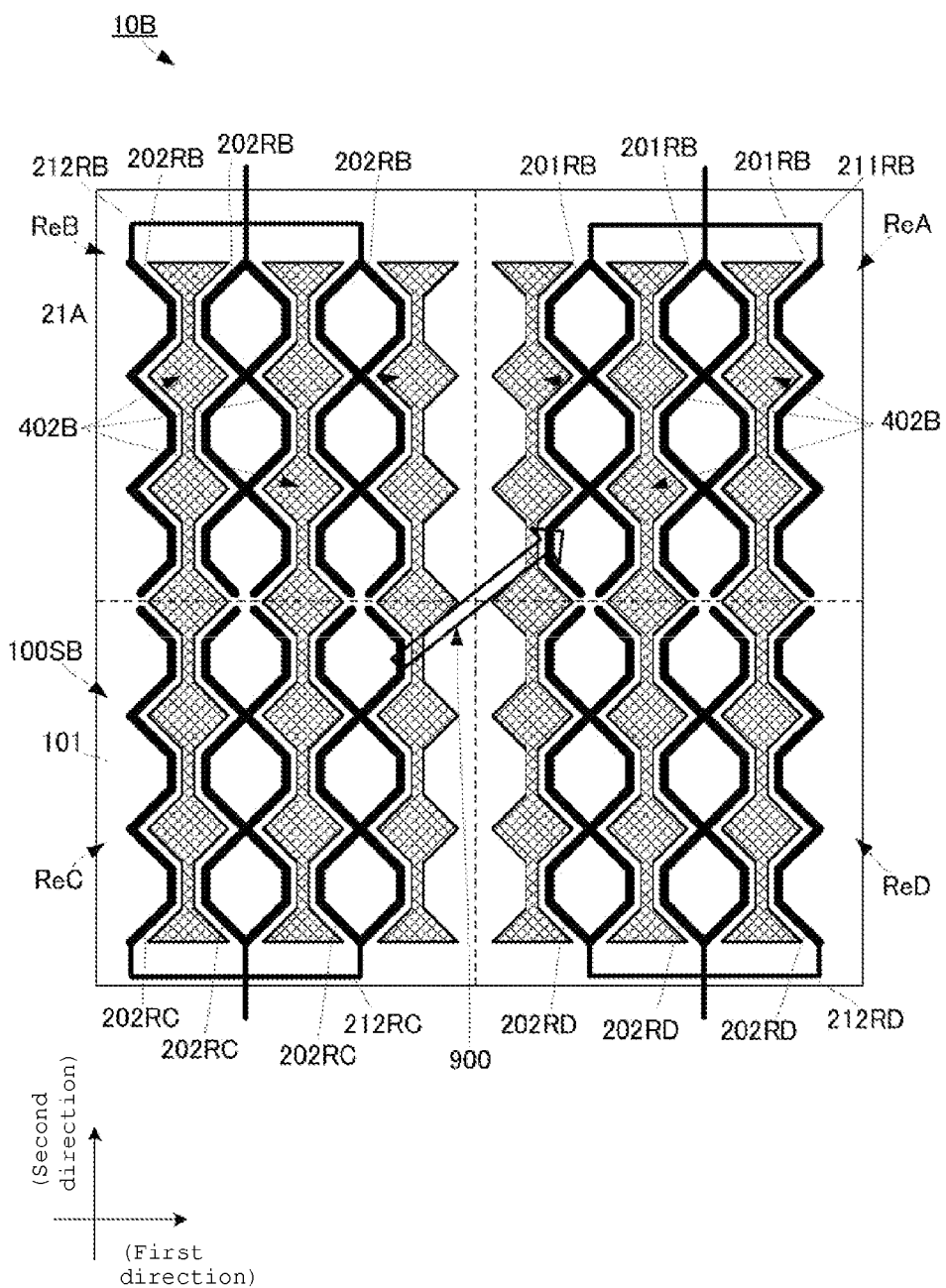
FIG. 6 is a rear view illustrating the structure of the touch panel in the touch type input device of the third embodiment of the present invention.

A touch type input device according to a third embodiment of the present invention will be described with reference to the drawings. FIG. 5 is a plan view illustrating a structure of a touch panel in the touch type input device of the third embodiment of the present invention. FIG. 6 is a rear view illustrating the structure of the touch panel in the touch type input device of the third embodiment of the present invention.

The touch type input device of the third embodiment differs from that of the first and second embodiments in a structure of a touch panel 10B. Accordingly, only the structure of the touch panel 10B will specifically be described below. Schematically, in the touch panel 10B of the third embodiment, the piezoelectric film 101 is also used as the base film of the electrostatic sensor.

As illustrated in FIG. 5, plural segment electrodes 401B each of which is formed into the lengthy shape in the first direction as a schematic shape are arrayed on the first principal surface of the piezoelectric film 101. The plural segment electrodes 401B are arrayed along the direction (second direction) orthogonal to the lengthy direction. In the segment electrode 401B, a wide portion and a narrow portion are alternately connected along the lengthy direction (first direction).

As illustrated in FIG. 5, displacement detecting electrodes 201B, 202B, 203B, and 204B are formed in the first principal surface that is one of principal surfaces of the piezoelectric film 101. The displacement detecting electrode 201B is formed in the detection region ReA of the first principal surface that is divided by virtual dividing lines. The dividing lines pass through the center of the first principal surface in a planar view, and are orthogonal to each side. The displacement detecting electrode 201B is a linear electrode. The displacement detecting electrode 201B is formed into a shape along an outer shape of the segment electrode 401B while separated from the outer shape by a predetermined distance within the detection region ReA. The displacement detecting electrodes 201B are connected to each other by a routed electrode 211B.

The displacement detecting electrode 202B is formed in the detection region ReB of the first principal surface that is divided by virtual dividing lines. The dividing lines pass through the center of the first principal surface in a planar view, and are orthogonal to each side. The displacement detecting electrode 202B is a linear electrode. The displacement detecting electrode 202B is formed into a shape along the outer shape of the segment electrode 401B while separated from the outer shape by a predetermined distance within the detection region ReB. The displacement detecting electrodes 202B are connected to each other by a routed electrode 212B.

The displacement detecting electrode 203B is formed in the detection region ReC of the first principal surface that is divided by virtual dividing lines. The dividing lines pass through the center of the first principal surface in a planar view, and are orthogonal to each side. The displacement detecting electrode 203B is a linear electrode. The displacement detecting electrode 203B is formed into a shape along the outer shape of the segment electrode 401B while separated from the outer shape by a predetermined distance within the detection region ReC. The displacement detecting electrodes 203B are connected to each other by a routed electrode 213B.

The displacement detecting electrode 204B is formed in the detection region ReD of the first principal surface that is divided by virtual dividing lines. The dividing lines pass through the center of the first principal surface in a planar view, and are orthogonal to each side. The displacement detecting electrode 204B is a linear electrode. The displacement detecting electrode 204B is formed into a shape along the outer shape of the segment electrode 401B while separated from the outer shape by a predetermined distance within the detection region ReD. The displacement detecting electrodes 204B are connected to each other by a routed electrode 214B.

As illustrated in FIG. 6, plural common electrodes 402B each of which is formed into the lengthy shape in the second direction as a schematic shape are arrayed on the other principal surface of the piezoelectric film 101. The plural common electrodes 402B are arrayed along the direction (first direction) orthogonal to the lengthy direction (second direction). In the common electrode 402B, a wide portion and a narrow portion are alternately connected along the lengthy direction. The lengthy direction of the common electrode 402B is orthogonal to the lengthy direction of the segment electrode 401B when the piezoelectric film 101 is viewed from above.

The displacement detecting electrodes 201RB, 202RB, 203RB, and 204RB are formed in the second principal surface of the piezoelectric film 101. The displacement detecting electrode 201RB is formed in the detection region ReA of the fourth principal surface that is divided by virtual dividing lines. The dividing lines pass through the center of the fourth principal surface in a planar view, and are orthogonal to each side. The displacement detecting electrode 201RB is a linear electrode. The displacement detecting electrode 201RB is formed into a shape along an outer shape of the common electrode 402B while separated from the outer shape by a predetermined distance within the detection region ReA. The displacement detecting electrode 201RB is formed so as to partially overlap the displacement detecting electrode 201B when the piezoelectric film 101 is viewed from above. The displacement detecting electrodes 201RB are connected to each other by a routed electrode 211RB.

The displacement detecting electrode 202RB is formed in the detection region ReB of the second principal surface that is divided by virtual dividing lines. The dividing lines pass through the center of the second principal surface in a planar view, and are orthogonal to each side. The displacement detecting electrode 202RB is a linear electrode. The displacement detecting electrode 202RB is formed into a shape along the outer shape of the common electrode 402B while separated from the outer shape by a predetermined distance within the detection region ReB. The displacement detecting electrode 202RB is formed so as to partially overlap the displacement detecting electrode 202B when the piezoelectric film 101 is viewed from above. The displacement detecting electrodes 202RB are connected to each other by a routed electrode 212RB.

The displacement detecting electrode 203RB is formed in the detection region ReC of the second principal surface that is divided by virtual dividing lines. The dividing lines pass through the center of the second principal surface in a planar view, and are orthogonal to each side. The displacement detecting electrode 203RB is a linear electrode. The displacement detecting electrode 203RB is formed into a shape along the outer shape of the common electrode 402B while separated from the outer shape by a predetermined distance within the detection region ReC. The displacement detecting electrode 203RB is formed so as to partially overlap the displacement detecting electrode 203B when the piezoelectric film 101 is viewed from above. The displacement detecting electrodes 203RB are connected to each other by a routed electrode 213RB.

The displacement detecting electrode 204RB is formed in the detection region ReD of the second principal surface that is divided by virtual dividing lines. The dividing lines pass through the center of the second principal surface in a planar view, and are orthogonal to each side. The displacement detecting electrode 204RB is a linear electrode. The displacement detecting electrode 204RB is formed into a shape along the outer shape of the common electrode 402B while separated from the outer shape by a predetermined distance within the detection region ReD. The displacement detecting electrode 204RB is formed so as to partially overlap the displacement detecting electrode 204B when the piezoelectric film 101 is viewed from above. The displacement detecting electrodes 204RB are connected to each other by a routed electrode 214RB.

In the touch panel 10B having the above configuration, similar effects to those of the first and second embodiments can be obtained. In the configuration of the third embodiment, the electrostatic sensor and the piezoelectric sensor can be formed with one piezoelectric film, therefore, it is not necessary to separately form the electrostatic sensor and the piezoelectric sensor. Accordingly, the touch type input device can be formed thinner. For a transparent touch type input device, transparency is improved because the number of electrode layers is decreased in a layer direction.

Note that, the above embodiments are exemplary electrode patterns and other patterns are possible as long as the electrostatic sensor and the piezoelectric sensor are formed into a single planar shape.

In the above embodiments, a PLLA film is used as the piezoelectric film only by way of example. For example, PDLA, poly-gamma-methylglutamate, poly-gamma-benzyl-glutamate, cellulose, collagen, poly-D-propylene oxide, PVDF, PVDF-TrFE copolymer, and polyurea may be used.

Although the above embodiments show four displacement detecting regions, the number of the displacement detecting regions is not limited to four, and can be any number greater than two.

Although the above description does not specify the types of sounds that can be used, the touch type input device according to the present invention is more effective in applications using a beep or an ultrasonic sound based on resonance.

For example, the kind of the sound includes the following.
(1) Sound Having a Frequency that Insects Dislike For example, various studies have shown that insect pests such as a mosquito and a cockroach dislike certain frequencies. Accordingly, when the sound having a frequency band including the frequency well known by various theories is emitted, the touch type input device can be used as a repellent to the desired insect.

(2) Sound Having a Frequency that a Specific Animal Dislikes

For example, a frequency that birds such as a crow and specific animals such as a mole and a cat dislike is experimentally well known. For example, a cat dislikes a frequency of about 20 kHz. Accordingly, when the sound is emitted at the frequency the specific animals dislike based on experimental results, the touch type input device can be used as an animal repellent to the desired animal.

(3) Sound that Allows Someone to Relax or have a Good Sleep

It is said that a frequency of an alpha wave ranges from 8 Hz to 13 Hz. Accordingly, the touch type input device can be used as a device generating a relaxing effect and a good sleep effect by emitting the frequencies of 8 Hz to 13 Hz.

(4) Sound that Uplifts a Mood of Someone

It is said that frequencies of about 10 Hz to about 20 Hz uplift a mood of someone. Accordingly, the touch type input device can be used as a device generating a mood uplifting effect by emitting the frequencies of about 10 Hz to about 20 Hz.

(5) Sound that Activates a Plant

It is said that a plant is activated by a sound at frequencies of 1 kHz or less, particularly a frequency of 40 Hz. Accordingly, the touch type input device can be used as a device promoting growth of a plant by emitting the sound at the frequencies of 1 kHz or less.

(6) Sound that Lures a Fish

It is well known that a fish is acutely sensitive to frequencies of about 100 Hz to about 1 kHz. Particularly, the frequency of about 300 Hz is used in automatic feeding. Accordingly, the touch type input device can be used as an auxiliary device that help catch more fish by emitting the sound at the frequencies of about 100 Hz to about 1 kHz.

DESCRIPTION OF REFERENCE SYMBOLS 1, 1A: touch type input device
10, 10B: touch panel
12: piezoelectric sensor
13: electrostatic sensor
14: displacement detector
15: touch position detector
16: controller
17: source playback unit
18: sound emission amplifier
19: relay switch
190, 191,192,193,194: switch
101: piezoelectric film
121: ReA voltage detector
122: ReB voltage detector
123: ReC voltage detector
124: ReD voltage detector
201, 202, 203, 204, 201R, 202R, 203R, 204R, 201B, 202B, 203B, 204B, 201RB, 202RB, 203RB, 204RB: displacement detecting electrode
211B, 212B, 213B, 214B, 211RB, 212RB, 213RB, 214RB: routed electrode
301: base film
401, 401B: segment electrode
402, 402B: common electrode
501: base board
502, 503: protective film
900: uniaxial drawing direction

The invention claimed is:

1. A touch type input device comprising:
   a touch panel having a piezoelectric sensor and an electrostatic sensor;
   a touch position detector that detects an operation input from a touch position detection voltage of the electrostatic sensor;
   a displacement detector that detects a pressing amount from a detection voltage of the piezoelectric sensor;
   a sound emission controller that provides a sound emission signal to the piezoelectric sensor;
   a switch unit that switches connection of the displacement detector and the sound emission controller to the piezoelectric sensor; and
   a controller that receives an operation input detection result from the touch position detector and controls the switch unit such that the displacement detector and the piezoelectric sensor are connected to each other.

2. The touch type input device according to claim 1, wherein the piezoelectric sensor and the electrostatic sensor are integral and share a main body.

3. The touch type input device according to claim 2, wherein the main body of the piezoelectric sensor and the electrostatic sensor is a single piezoelectric film, and an electrostatic capacitance detecting electrode and a displacement detecting electrode are positioned on an identical surface of the piezoelectric film.

4. The touch type input device according to claim 3, wherein the piezoelectric film is made of poly lactic acid.

5. The touch type input device according to claim 4, wherein the piezoelectric film is uniaxially drawn in a predetermined direction.

6. The touch type input device according to claim 5, wherein the predetermined direction is at a predetermined angle with respect to a length and a width direction of the piezoelectric film.

7. A touch type input device comprising:
   a touch panel having a piezoelectric sensor and an electrostatic sensor;
   a touch position detector that detects an operation input from a touch position detection voltage of the electrostatic sensor;
   a displacement detector that detects a pressing amount from a detection voltage of the piezoelectric sensor;
   a sound emission controller that includes a source playback unit and a sound emission amplifier, the source playback unit generating a sound emission signal provided to the piezoelectric sensor, the sound emission amplifier amplifying the sound emission signal to output the amplified sound emission signal to the piezoelectric sensor;
   a switch unit that switches between a first path and a second path; and
   a controller that outputs a switch control signal to the switch unit instructing the switch unit to switch between the first path and the second path,
   wherein the displacement detector and the controller are connected to each other in the first path, the source playback unit and the sound emission amplifier are connected to each other in the second path, and
   the controller receives an operation input detection result from the touch position detector, and generates the switch control signal switching from the second path to the first path.

8. The touch type input device according to claim 7, wherein the piezoelectric sensor and the electrostatic sensor are integral and share a main body.

9. The touch type input device according to claim 8, wherein the main body of the piezoelectric sensor and the electrostatic sensor is a single piezoelectric film, and an electrostatic capacitance detecting electrode and a displacement detecting electrode are positioned on an identical surface of the piezoelectric film.

10. The touch type input device according to claim 9, wherein the piezoelectric film is made of poly lactic acid.

11. The touch type input device according to claim 10, wherein the piezoelectric film is uniaxially drawn in a predetermined direction.

12. The touch type input device according to claim 11, wherein the predetermined direction is at a predetermined angle with respect to a length and a width direction of the piezoelectric film.

\* \* \* \* \*